(12) United States Patent
Kaneoka

(10) Patent No.: US 6,448,189 B1
(45) Date of Patent: Sep. 10, 2002

(54) METHOD OF MANUFACTURING A SEMICONDUCTOR MEMORY DEVICE HAVING A CAPACITOR WITH IMPROVED DIELECTRIC LAYER

(75) Inventor: Tatsunori Kaneoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/059,122

(22) Filed: Jan. 31, 2002

Related U.S. Application Data

(62) Division of application No. 09/440,701, filed on Nov. 16, 1999, now Pat. No. 6,344,394.

(30) Foreign Application Priority Data

Jun. 3, 1999 (JP) .............................................. 11-156424

(51) Int. Cl.[7] ....................... H01L 21/336; H01L 21/31; H01L 21/469
(52) U.S. Cl. ....................... 438/775; 438/261; 438/287; 438/763; 438/770
(58) Field of Search ................................ 438/257, 261, 438/287, 763, 770, 775

(56) References Cited

U.S. PATENT DOCUMENTS

| | | | |
|---|---|---|---|
| 4,774,197 A | 9/1988 | Haddad et al. | |
| 5,304,829 A | 4/1994 | Mori et al. | 257/324 |
| 5,318,920 A * | 6/1994 | Hayashide | 437/47 |
| 5,422,291 A | 6/1995 | Clementi et al. | |
| 5,460,992 A | 10/1995 | Hasegawa | 437/43 |
| 5,600,166 A | 2/1997 | Clementi et al. | |
| 5,619,051 A | 4/1997 | Endo | |
| 5,661,056 A | 8/1997 | Takeuchi | 438/261 |
| 5,780,341 A | 7/1998 | Ogura | |
| 5,856,221 A | 1/1999 | Clementi et al. | |
| 5,966,602 A | 10/1999 | Kawazu et al. | |
| 6,133,093 A | 10/2000 | Prinz et al. | |
| 6,171,900 B1 | 1/2001 | Sun | |
| 6,204,142 B1 * | 3/2001 | Thakur | 438/396 |
| 6,248,628 B1 | 6/2001 | Halliyal et al. | |
| 6,316,308 B1 * | 11/2001 | Thakur | 438/240 |
| 6,344,394 B1 * | 2/2002 | Kaneoka | 438/261 |

FOREIGN PATENT DOCUMENTS

EP   0 571 692   1/1993

* cited by examiner

*Primary Examiner*—Alexander Ghyka
(74) *Attorney, Agent, or Firm*—McDermott, Will & Emery

(57) ABSTRACT

In the manufacture of a semiconductor memory device having a capacitor formed by arranging a dielectric film including two layers of a silicon oxide film and a silicon nitride film between two electrode films, a thin dielectric film is formed by forming the silicon nitride film on a silicon conductive film by thermally nitriding said silicon conductive film using NO gas, then laminating a silicon oxide film on said silicon nitride film by a CVD method. The erasing/writing speed of semiconductor memory devices, in particular of flash memories or the like, is improved.

3 Claims, 6 Drawing Sheets

PRIOR ART

METHOD OF MANUFACTURING A SEMICONDUCTOR MEMORY DEVICE HAVING A CAPACITOR WITH IMPROVED DIELECTRIC LAYER

This application is a divisional of application Ser. No. 09/440,701 filed Nov. 16, 1999 now U.S. Pat. No. 6,344,394.

BACKGROUND OF THE INVENTION

1. Field of the Invention

The present invention relates to a method of manufacturing a semiconductor memory device having a capacitor, and more particularly, to a method of manufacturing a capacitor having an improved dielectric layer between two electrodes, such as control and floating gate electrodes of a nonvolatile memory element represented by a flash memory.

2. Background Art

Referring to drawings, conventional nonvolatile memory elements and a method for manufacturing such elements will be described.

FIG. 5 shows an example of the cross sectional structure of a memory cell in a prior art flash memory, viewed from a word-line direction. In FIG. 5, 1 is a silicon substrate, 2 is a tunnel oxide film formed by thermal oxidation method, 3 is an element isolating silicon oxide film for electrically isolating between adjacent memory cells, 4 is an n-type impurity layer formed with phosphorus, arsenic, or the like on the silicon substrate 1, 5 is a floating gate electrode consisting of phosphorus-doped polycrystalline silicon, 8 is a control gate electrode consisting of phosphorus-doped polycrystalline silicon, 9 is a silicon oxide film for electrically insulating the floating gate electrode 5 and the control gate electrode 8 from adjacent memory cells, 10 is a lower-layer metal wiring, 11 is a silicon oxide film between lower-layer metal wirings 10 adjacent to each other, 12 is a upper-layer metal wiring, 13 is a silicon oxide film between the lower-layer metal wiring 10 and the upper-layer metal wiring 12, 20 is a lower silicon oxide film, 21 is a CVD-silicon nitride film, and 22 is an upper silicon oxide film.

In such a conventional flash memory, the dielectric film between the control gate electrode and the floating gate electrode for data retention characteristic is formed by three layers of the lower silicon oxide film 20, the CVD-silicon nitride film 21, and the upper silicon oxide film 22.

FIG. 6 shows the process for manufacturing a capacitor portion between the control and floating gate electrodes in a conventional example of flash memories, and shows cross sectional structures of the capacitor between the control and floating gate electrodes viewed from the bit-line direction.

In the conventional manufacturing method, first referring to FIG. 6(a), a phosphorus-doped amorphous silicon film 14 is deposited. Here, 1 is a silicon substrate, 2 is a tunnel oxide film, and 3 is an element isolating silicon oxide film. The phosphorus-doped amorphous silicon film can be formed, for example, by the CVD method using monosilane $SiH_4$ and phosphine $PH_3$ at 500–550° C. The phosphorus concentration in the phosphorus-doped amorphous silicon film 14 can be controlled by changing the ratio of flow-rates of monosilane $SiH_4$ and phosphine $PH_3$.

Next, referring to FIG. 6(b), the phosphorus-doped amorphous silicon film 14 is processed into a desired shape by lithography and dry etching technology.

Referring now to FIG. 6(c), a lower siliconoxide film 20 is formed on the phosphorus-doped amorphous silicon film 14 by the thermal CVD method using monosilane $SiH_4$ and dinitrogen monoxide $N_2O$, or dichlorosilane $SiH_2Cl_2$ and dinitrogen monoxide $N_2O$ at 700–900° C. At this time, the phosphorus-doped amorphous silicon film 14 is crystallized by the thermal energy on deposition, and is converted to a floating gate electrode 5 consisting of a phosphorus-doped polycrystalline silicon.

Next, referring to FIG. 6(d), a CVD-silicon nitride film 21 is deposited on the lower silicon oxide film 20 by the thermal CVD method using monosilane $SiH_4$ or dichlorosilane $SiH_2Cl_2$ and ammonia $NH_3$ at 600–900° C.

Next, referring to FIG. 6(e), an upper CVD-silicon oxide film 23 is formed on the CVD-silicon nitride film 21 by the thermal CVD method using monosilane $SiH_4$ and dinitrogen monoxide $N_2O$, or dichlorosilane $SiH_2Cl_2$ and dinitrogen monoxide $N_2O$ at 700–900° C.

Next, referring to FIG. 6(f), a dense upper silicon oxide film 22 is formed by annealing the upper CVD-silicon oxide film 23 in a steam atmosphere.

Finally, referring to FIG. 6(g), a control gate electrode 8 formed of a phosphorus-doped polycrystalline silicon film is deposited on the upper silicon oxide film 22, and a capacitor between the control and floating gate electrodes is formed by lithography and dry etching process. The control gate electrode 8 can be formed by the CVD method using monosilane $SiH_4$ and phosphine $PH_3$ at 620° C.

In this conventional nonvolatile memory element, the dielectric film between the control and floating gate electrodes for data retention is formed by three layers of the lower silicon oxide film 20, the CVD-silicon nitride film 21, and the upper silicon oxide film 22.

Since a three-layer structure of lower silicon oxide film/CVD-silicon nitride film/upper silicon oxide film is used in a conventional nonvolatile storage element, for example, the dielectric film between the control and floating gate electrodes of a flash memory, it was difficult to decrease the thickness of the element. Consequently, the erasing/writing speed of the flash memory was lowered.

In order to solve the above-described problems at the same time, an object of the present invention is to provide a very thin dielectric film between control and floating gate electrodes having an improved erasing/writing speed of semiconductor memory devices, in particular of flash memories or the like.

SUMMARY OF THE INVENTION

According to one aspect of the present invention, in a method of manufacturing a semiconductor memory device having a capacitor formed by arranging a dielectric film consisting of two layers of a silicon oxide film and a silicon nitride film between a silicon film and another electrode film, for forming the dielectric film, the silicon film is thermally nitrided by using NO gas to form a silicon nitride film on the silicon film, and thereafter a silicon oxide film is laminated on the silicon nitride film.

According to another aspect of the present invention, in a method of manufacturing a semiconductor memory device having a capacitor formed by arranging a dielectric film consisting of two layers of a silicon oxide film and a silicon nitride film between a silicon film and another electrode film, for forming the dielectric film, a silicon oxide film is formed on the silicon film by a CVD method, and thereafter a silicon nitride film is formed on the interface of the silicon film with the silicon oxide film by thermally nitriding the silicon film using NO gas.

According to another aspect of the present invention, in a method of manufacturing a semiconductor memory device having a capacitor formed by arranging a dielectric film consisting of two layers of a silicon oxide film and a silicon nitride film between a silicon film and another electrode film, for forming the dielectric film, a silicon oxide film is formed on the silicon film by dry oxidation method, and thereafter a silicon nitride film is formed on the interface of the silicon film with the silicon oxide film by thermally nitriding the silicon film using NO gas.

Other and further objects, features and advantages of the invention will appear more fully from the following description.

DETAILED DESCRIPTION OF THE PREFERRED EMBODIMENTS

Figure 1:
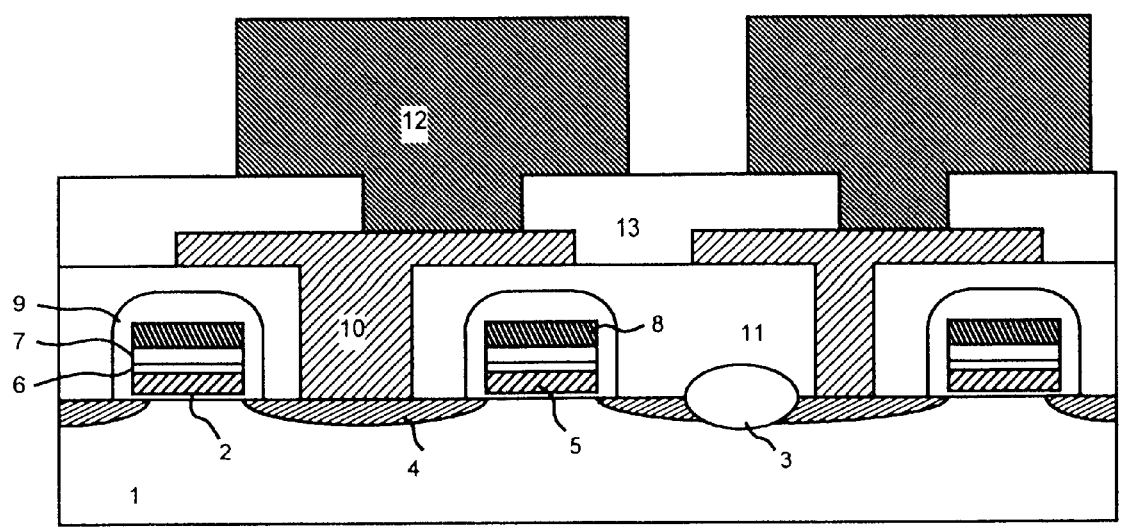
FIG. 1 shows an example of the cross sectional structures of a memory cell viewed from the word-line direction of a flash memory as a semiconductor memory device according to the present invention.

The embodiments of the present invention will be described below referring to drawings. The same or corresponding components in the drawings are represented by the same symbols, and the description of such components will be simplified or omitted.

First Embodiment

FIG. 1 shows an example of the cross sectional structures of a memory cell viewed from the word-line direction of a flash memory as a semiconductor memory device according to the present invention. In FIG. 1, 1 is a silicon substrate, 2 is a tunnel oxide film formed by thermal oxidation method, 3 is an element isolating silicon oxide film for electrically isolating between adjacent memory cells, 4 is an n-type impurity layer formed with phosphorus or arsenic on the silicon substrate 1, 5 is a floating gate electrode consisting of phosphorus-doped polycrystalline silicon, 6 is a silicon nitride film layer, 7 is a silicon oxide film, 8 is a control gate electrode consisting of phosphorus-doped polycrystalline silicon, 9 is a silicon oxide film for electrically insulating the floating gate electrode 5 and the control gate electrode 8 from adjacent memory cells, 10 is a lower-layer metal wiring, 11 is a silicon oxide film between lower-layer metal wirings 10 adjacent to each other, 12 is a upper-layer metal wiring, and 13 is a silicon oxide film between the lower-layer metal wiring 10 and the upper-layer metal wiring 12.

In this embodiment, the dielectric film between the control and floating gate electrodes for data retention is formed by two layers of the silicon nitride film layer 6 and the silicon oxide film 7.

FIG. 2 is a diagram showing an example of the method for manufacturing a capacitor between the control and floating gate electrodes of a flash memory according to First Embodiment of the present invention, and shows the cross sectional structure of the capacitor between the control and floating gate electrodes viewed from the bit-line direction.

Figure 2A:
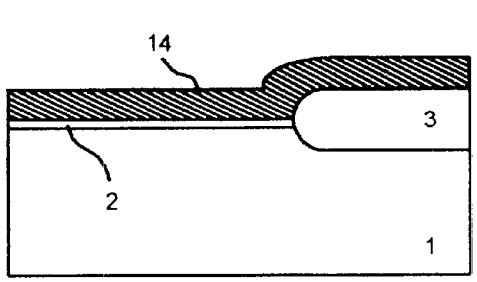
FIG. 2(a) through FIG. 2(f) are a diagram showing an example of the method for manufacturing a capacitor between the control and floating gate electrodes of a flash memory according to First Embodiment of the present invention, and shows the cross sectional structure of the capacitor between the control and floating gate electrodes viewed from the bit-line direction.

Referring to FIG. 2(a), a phosphorus-doped amorphous silicon film 14 is deposited. Here, 1 is a silicon substrate, 2 is a tunnel oxide film, and 3 is an element isolating silicon oxide film. The phosphorus-doped amorphous silicon film 14 can be formed, for example, by the thermal CVD method using monosilane $SiH_4$ and phosphine $PH_3$ at 500–550° C. The phosphorus content in the phosphorus-doped amorphous silicon film 14 can be controlled by changing the ratio of flow-rates of monosilane $SiH_4$ and phosphine $PH_3$.

Figure 2E:
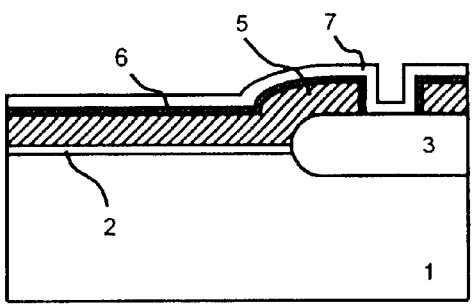
Figure 2B:
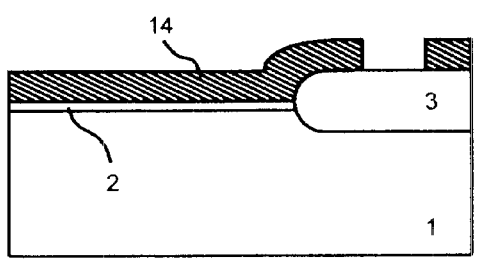

Next, referring to FIG. 2(b), the phosphorus-doped amorphous silicon film 14 deposited in FIG. 2(a) is processed into a desired shape by lithography and dry etching method.

Figure 2F:
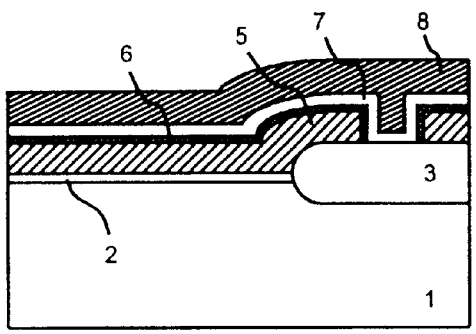
Figure 2C:
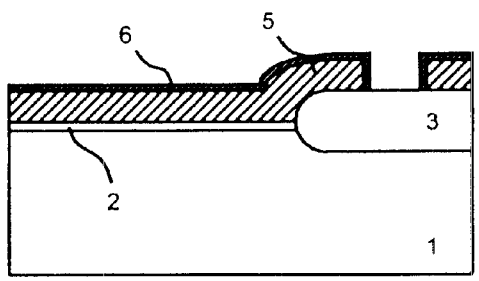

Referring to FIG. 2(c), the phosphorus-doped amorphous silicon film 14 is annealed in an NO gas or NO-gas containing atmosphere at 850–1150° C. At this time, the phosphorus-doped amorphous silicon film 14 is converted to a floating gate electrode 5 consisting of a phosphorus-doped polycrystalline silicon by thermal energy, and a silicon nitride film layer 6 is further formed on this floating gate electrode 5.

Figure 2D:
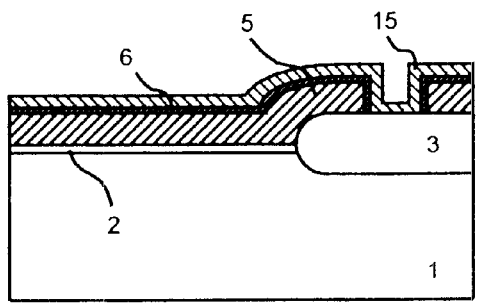

Next, referring to FIG. 2(d), a CVD-silicon oxide film 15 is formed by the thermal CVD method using monosilane $SiH_4$ and dinitrogen monoxide $N_2O$, dichlorosilane $SiH_2Cl_2$ and dinitrogen monoxide $N_2O$, or the like at 700–900° C.

Referring now to the following FIG. 2(e), a dense silicon oxide film 7 is formed by annealing the CVD-silicon oxide film 15 in a steam atmosphere. At this time, since the silicon nitride film layer 6 restrains the diffusion of the oxidant, the oxidation of the floating gate electrode 5 can be prevented.

Finally, referring to FIG. 2(f), a control gate electrode 8 formed of a phosphorus-doped polycrystalline silicon film is deposited on the silicon oxide film 7, and a capacitor between the control and floating gate electrodes is formed by lithography and dry etching process. The control gate electrode 8 can be formed by the CVD method using monosilane $SiH_4$ and phosphine $PH_3$ at 620° C. Unlike the prior art, the dielectric film structure between the control and floating gate electrodes is a two-layer structure of the silicon nitride film layer 6 and the silicon oxide film 7.

According to this embodiment, as described above, there is formed a thin dielectric film consisting of two layers of a silicon nitride layer and a silicon oxide film, by forming a silicon nitride film on the upper surface of the floating gate electrode between the control and floating gate electrodes of a semiconductor memory device by thermal nitriding using NO gas, then forming a silicon oxide film by the CVD method, thereby the erasing/writing speed of the flash memory or the like can be increased.

Second Embodiment

FIG. 3 is a diagram showing an example of methods for manufacturing a capacitor between the control and floating gate electrodes of a flash memory according to Second Embodiment of the present invention, and shows sectional structures of the capacitor between the control and floating gate electrodes viewed from the bit-line direction.

Figure 3A:
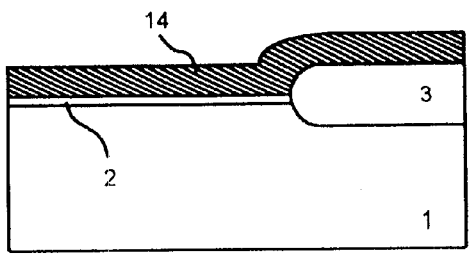
FIGS. 3(a) through 3(f) are a diagram showing an example of methods for manufacturing a capacitor between the control and floating gate electrodes of a flash memory according to Second Embodiment of the present invention.

In this manufacturing method, first referring to FIG. 3(a), a phosphorus-doped amorphous silicon film 14 is deposited in the same way as shown in FIG. 2(a) of First Embodiment. Here, 1 is a silicon substrate, 2 is a tunnel oxide film, and 3 is an element isolating silicon oxide film.

Figure 3B:
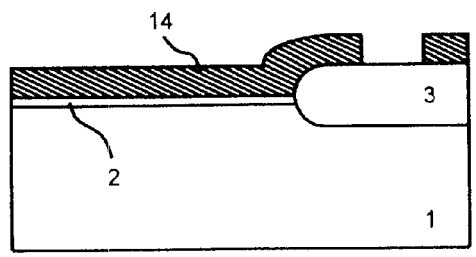

Next, referring to FIG. 3(b), the phosphorus-doped amorphous silicon film 14 is processed into a desired shape by lithography and dry etching technology.

Figure 3C:
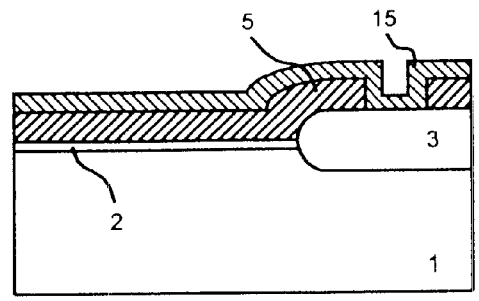

Next, referring to FIG.3(c), a CVD-siliconoxide film 15 is formed by the thermal CVD method using monosilane $SiH_4$ and dinitrogen monoxide $N_2O$, dichlorosilane $SiH_2Cl_2$ and dinitrogen monoxide $N_2O$, or the like at 700–900° C. At this time, the phosphorus-doped amorphous silicon film 14 is converted to a floating gate electrode 5 consisting of a phosphorus-doped polycrystalline silicon by thermal energy.

Figure 3D:
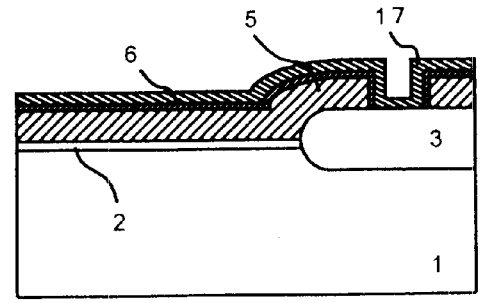

Referring now to FIG. 3(d), annealing is performed in an NO gas or NO-gas containing atmosphere at 850–1150° C. At this time, a silicon nitride film layer 6 is formed on the floating gate electrode 5 by thermal energy, and a CVD-silicon oxide film 15 is converted to an NO nitrided CVD-silicon oxide film 17.

Figure 3E:
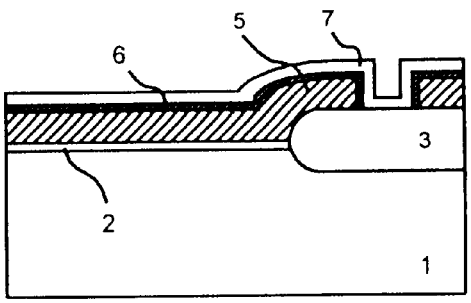

Referring to FIG. 3(e), a dense silicon oxide film 7 is formed by annealing the NO nitrided CVD-silicon oxide film 17 in a steam atmosphere. At this time, since the silicon nitride film layer 6 restrains the diffusion of the oxidant, the oxidation of the floating gate electrode 5 can be prevented.

Figure 3F:
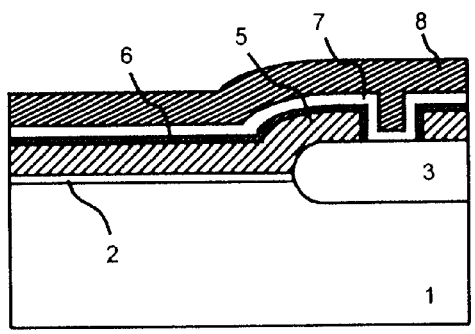

Finally, referring to FIG. 3(f), a control gate electrode 8 formed of a phosphorus-doped polycrystalline silicon film is deposited on the silicon oxide film 7, and a capacitor between the control and floating gate electrodes is formed by lithography and dry etching process. The control gate electrode 8 can be formed by the CVD method using monosilane $SiH_4$ and phosphine $PH_3$ at 620° C.

In this embodiment, unlike the prior art, the dielectric film structure between the control and floating gate electrodes is a two-layer structure of the silicon nitride film layer 6 and the silicon oxide film 7.

According to this embodiment, as described above, there can be formed a thin dielectric film consisting of two layers of a silicon nitride layer and a silicon oxide film, by forming a silicon oxide film on the upper surface of the floating gate electrode between the control and floating gate electrodes of a semiconductor memory device by the CVD method, then forming a silicon nitride film on the floating gate electrode by thermal nitriding using NO gas, thereby the erasing/writing speed of the flash memory or the like can be increased.

Third Embodiment

FIG. 4 is a diagram showing an example of methods for manufacturing a capacitor between the control and floating gate electrodes of a flash memory according to Third Embodiment of the present invention, and shows cross sectional structures of the capacitor between the control and floating gate electrodes viewed from the bit-line direction.

Figure 4A:
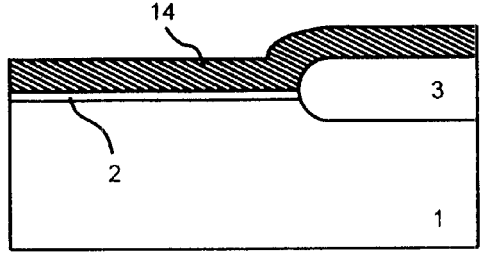
FIGS. 4(a) through 4(f) are; and a diagram showing an example of methods for manufacturing a capacitor between the control and floating gate electrodes of a flash memory according to Third Embodiment of the present invention.

In this manufacturing method, first referring to FIG. 4(a), a phosphorus-doped amorphous silicon film 14 is deposited in the same way as shown in FIG. 2(a) of First Embodiment. Here, 1 is a silicon substrate, 2 is a tunnel oxide film, and 3 is an element isolating silicon oxide film.

Figure 4B:
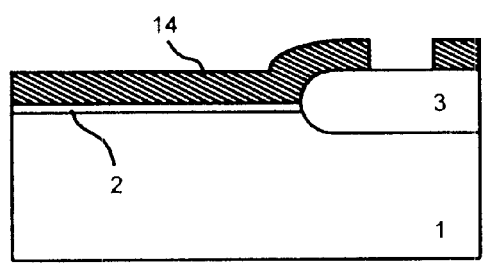

Next, referring to FIG. 4(b), the phosphorus-doped amorphous silicon film 14 is processed into a desired shape by lithography and dry etching technology.

Figure 4C:
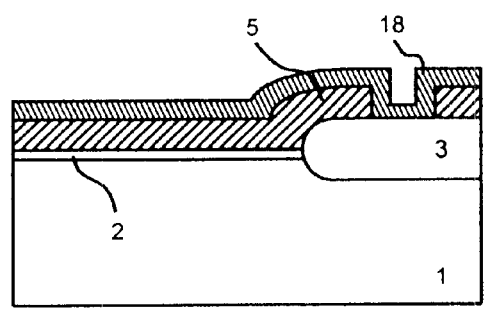

Next, referring to FIG. 4(c), a polysilicon thermal oxide film 18 is formed by the oxidation method in a dry oxygen atmosphere at 700–1000° C. At this time, the phosphorus-doped amorphous silicon film 14 is converted to a floating gate electrode 5 consisting of a phosphorus-doped polycrystalline silicon by thermal energy.

Figure 4D:
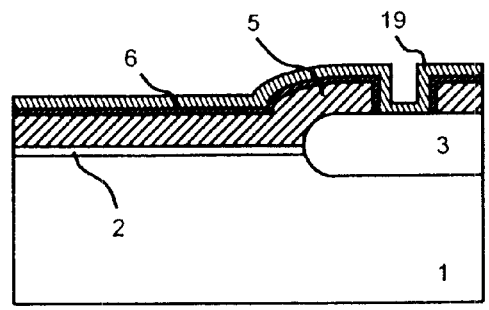

Referring now to FIG. 4(d), annealing is performed in an NO gas or NO-gas containing atmosphere at 850–1150° C. At this time, a silicon nitride film layer 6 is formed on the floating gate electrode 5 by thermal energy, and the polysilicon thermal oxide film 18 is converted to an NO nitrided polysilicon thermal oxide film 19.

Figure 4E:
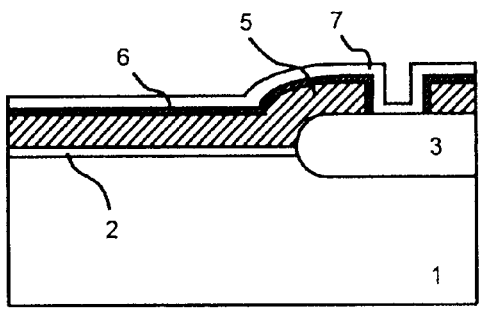

Next, referring to FIG. 4(e), a dense silicon oxide film 7 is formed by annealing the NO nitrided polysilicon thermal oxide film 19 in a steam atmosphere. At this time, since the silicon nitride film layer 6 restrains the diffusion of the oxidant, the silicon oxide film 7 can be prevented from increasing its thickness.

Figure 4F:
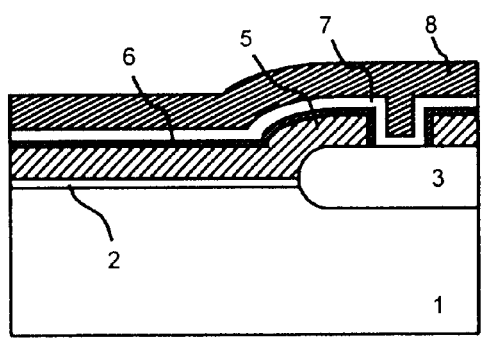
Figure 5:
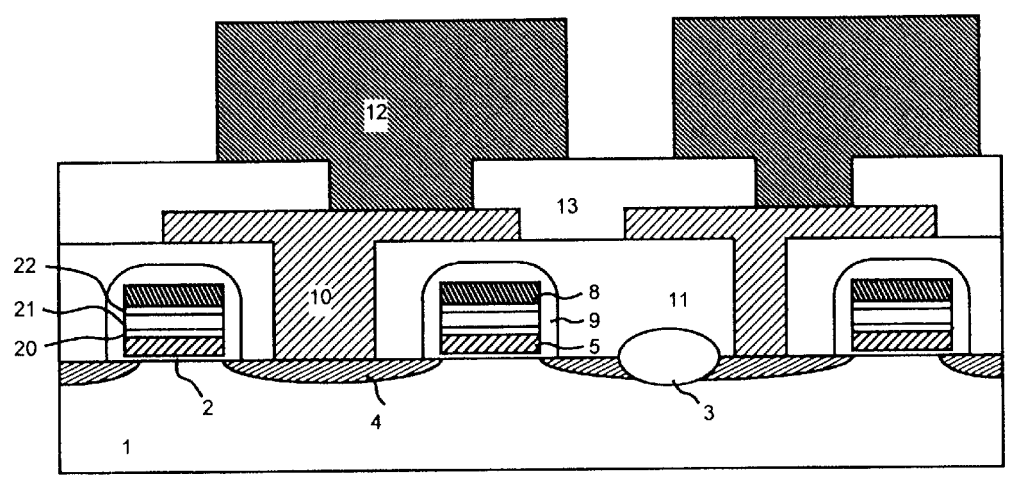
FIG. 5 shows an example of the cross sectional structure of a memory cell in a prior art flash memory, viewed from a word-line direction.
Figure 6A:
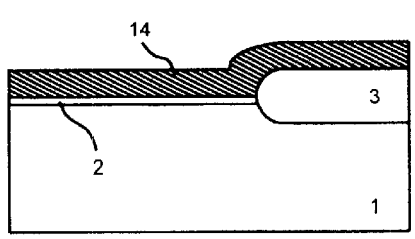
FIGS. 6(a) through 6(g) shows the process for manufacturing a capacitor portion between the control and floating gate electrodes in a conventional example of flash memories, and shows cross sectional structures of the capacitor between the control and floating gate electrodes viewed from the bit-line direction.
Figure 6B:
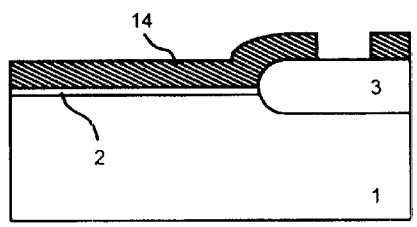
Figure 6C:
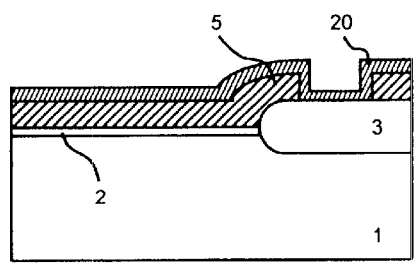
Figure 6D:
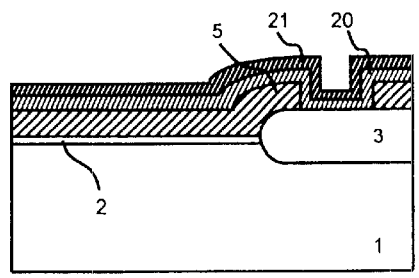
Figure 6E:
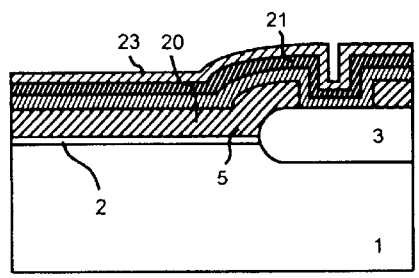
Figure 6F:
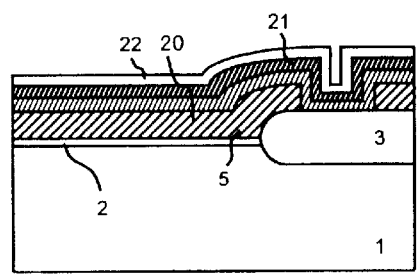
Figure 6G:
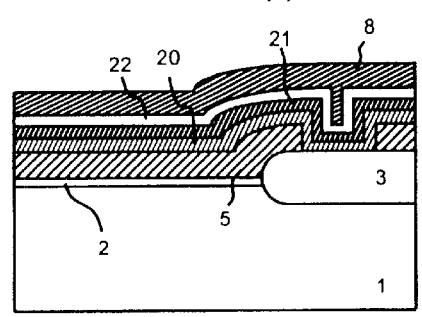

Finally, referring to FIG. 4(f), a control gate electrode 8 formed of a phosphorus-doped polycrystalline silicon film is deposited on the silicon oxide film 7, and a capacitor between the control and floating gate electrodes is formed by lithography and dry etching process. The control gate electrode 8 can be formed by the CVD method using monosilane $SiH_4$ and phosphine $PH_3$ at 620° C.

In this embodiment, unlike the prior art, the dielectric film structure between the control and floating gate electrodes is a two-layer structure of the silicon nitride film layer 6 and the silicon oxide film 7.

According to this embodiment, as described above, there can be formed a thin dielectric film consisting of two layers of a silicon nitride layer and a silicon oxide film, by forming a silicon oxide film on the upper surface of the floating gate electrode between the control and floating gate electrodes of a semiconductor memory device by dry oxidation method, then forming a silicon nitride film on the floating gate electrode by thermal nitriding using NO gas, thereby the erasing/writing speed of the flash memory or the like can be increased.

According to the present invention as described above with three embodiments, since the thickness of the dielectric film is decreased by forming the dielectric film consisting of two layers of a silicon nitride layer and a silicon oxide film on the upper surface of the floating gate electrode by nitriding using NO gas, the erasing/writing speed of the flash memory or the like can be increased.

As the result, the present invention contributes to the realization of higher reliability of semiconductor memory devices such as flash memories, and to the advancement of electronic devices.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-156424, filed on Jun. 3, 1999 including specification, claims, drawings and summary, on which the Convention priority of the present application is based, are incorporated herein by reference in its entirety.

What is claimed is:

1. A method of manufacturing a semiconductor memory device having a capacitor formed by arranging a dielectric film consisting of two layers of a silicon oxide film and a silicon nitride film between a silicon film and another electrode film;

said method comprising the steps, for forming said dielectric film, of:

forming a silicon oxide film on said silicon film by dry oxidation method; and thereafter forming a silicon nitride film on the interface of said silicon film with said silicon oxide film by thermally nitriding said silicon film using NO gas.

2. The method of manufacturing a semiconductor memory device according to claim 1, wherein said silicon film is formed of a phosphorus-doped amorphous silicon film.

3. The method of manufacturing a semiconductor memory device according to claim 1, wherein said silicon oxide film is further annealed in a steam atmosphere for forming a dense silicon oxide film.

* * * * *